(12) United States Patent
Kobata

(10) Patent No.: US 8,466,724 B2
(45) Date of Patent: Jun. 18, 2013

(54) FREQUENCY SYNTHESIZER

(75) Inventor: Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 517 days.

(21) Appl. No.: 12/736,023

(22) PCT Filed: Mar. 2, 2009

(86) PCT No.: PCT/JP2009/054362
§ 371 (c)(1),
(2), (4) Date: Sep. 2, 2010

(87) PCT Pub. No.: WO2009/113466
PCT Pub. Date: Sep. 17, 2009

(65) Prior Publication Data
US 2011/0001523 A1    Jan. 6, 2011

(30) Foreign Application Priority Data

Mar. 12, 2008   (JP) ................................. 2008-063095

(51) Int. Cl.
*H03L 7/06*    (2006.01)
(52) U.S. Cl.
USPC ........................................................ 327/156
(58) Field of Classification Search
None
See application file for complete search history.

(56) References Cited

U.S. PATENT DOCUMENTS 5,128,625 A * 7/1992 Yatsuzuka et al. ............ 327/156

FOREIGN PATENT DOCUMENTS

| JP | 53-020980 | 2/1978 |
|---|---|---|
| JP | 63-178642 | 7/1988 |
| JP | 4-092514 | 3/1992 |
| JP | 4-200115 | 7/1992 |
| JP | 5-268078 | 10/1993 |
| JP | 2000-252819 | 9/2000 |
| JP | 2004-274673 | 9/2004 |
| JP | 2005-101956 | 4/2005 |
| JP | 2007-295537 | 11/2007 |

* cited by examiner

*Primary Examiner* — Daniel Rojas
(74) *Attorney, Agent, or Firm* — Jordan and Hamburg LLP

(57) ABSTRACT

Provided is a frequency synthesizer capable of fine setting over a wide band and having a wide frequency pull-in range. A sine wave signal of an output frequency of a voltage controlled oscillating part is quadrature-detected, and in a PLL utilizing a vector rotating at a frequency (velocity) equal to a difference from a frequency of a frequency signal used for the detection, a frequency pull-in means integrates a first constant for increasing the output frequency as a pull-in voltage when a control voltage from the PLL to the voltage controlled oscillating part is larger than a prescribed set range, and integrates a second constant for decreasing the output frequency as the pull-in voltage when the control voltage is smaller than the set range. Then, an adding means adds the control voltage from the PLL and the pull-in voltage from the frequency pull-in means to output an addition result to the voltage controlled oscillating part.

3 Claims, 13 Drawing Sheets

US 8,466,724 B2

FREQUENCY SYNTHESIZER

TECHNICAL FIELD

The present invention relates to a frequency synthesizer from which an oscillation output with a desired frequency can be obtained.

BACKGROUND ART

As one of standard signal generators, there is a frequency synthesizer to which PLL (Phase Locked Loop) is applied. As shown in FIG. 14, the frequency synthesizer N-divides a frequency of a voltage controlled oscillator 202 by a frequency divider 202 to input a frequency divider output to one of input ends of a phase comparator 203, and in addition, M-divides an oscillation output of, for example, a quartz-crystal oscillator 204, which is a reference signal generator, by a frequency divider 200 to input a frequency divider output to the other input end of the phase comparator 203, and feeds a comparison signal between these outputs back to the voltage controlled oscillator 201 via a loop filter 205, thereby forming a PLL (for example, patent document 1). When the PLL is locked, a relation between a frequency fvco of the oscillation output of the voltage controlled oscillator 201 and a frequency f0 of the oscillation output of the quartz-crystal oscillator 204 is fvco/N=f0/M, and therefore, fvco=(N/M)f0. The frequency divider 202 is formed by a programmable counter and the frequency divider ratio N thereof can be externally set by digital data, enabling the free setting of the frequency fvco.

The application of the frequency synthesizer includes its use as, for example, a local oscillating part in a mobile station. Specifically, since a base station allocates a predetermined frequency band to a mobile station, the mobile station side needs to generate an oscillation output in the allocated frequency band, which necessitates the local oscillating part to have a function of capable of adjusting the frequency. The frequency synthesizer is also used as a test signal source of a radio communication device, a broadcasting device, and the like.

When the frequency synthesizer is thus applied in, for example, a communication field, its noise has to be small in order to avoid the interference with other channels, and it is desirably capable of setting the frequency as finely as possible because radio waves have been congested. Increasing the aforesaid frequency divider ratio N enables the fine setting of the frequency, but an excessive increase in the frequency divider ratio N causes an increase in noise due to an elongated delay occurring in the loop, and actually about 1000 is an upper limit of N.

Therefore, in order to design a frequency synthesizer capable of adjusting the frequency, for example, in about 1000 MHz range for convenience sake, in 1 Hz increments, the device in FIG. 14 has to be multi-staged. Specifically, assuming that the upper limit of N is 1000, it is possible to produce a frequency synthesizer capable of adjusting the frequency within a 1 MHz to 1000 MHz range in 1 MHz increments, by setting the frequency (f0/M) of the reference signal input to the phase comparator 203 to 1 MHz. Likewise, it is possible to produce a frequency synthesizer capable of setting the frequency within a 1 kHz to 1 MHz range in 1 kHz increments by setting the frequency of the reference signal to 1 kHz, and similarly, it is possible to produce a frequency synthesizer capable of setting the frequency within a 1 Hz to 1 kHz range in 1 Hz increments, by setting the frequency of the reference signal to 1 Hz. Then, by synthesizing these frequency synthesizers in stages, it is possible to obtain a frequency synthesizer capable of setting the frequency up to 1000 Mherz in 1 Hz increments.

However, the above method requires the formation of PLLs for respective synthesizing circuits synthesizing the frequencies, and thus has a problem of complicating the circuit configuration and increasing the number of components, leading to great noise.

Therefore, the present inventor has developed a frequency synthesizer of a new type capable of finely setting the frequency over a wide band by adopting a new structure having a totally different principle from that of a conventional frequency synthesizer (for example, patent document 2), and as its element technology, has studied various circuit configurations enabling stable pull-in of the frequency even when there are product variations in voltage controlled oscillating parts, a temperature characteristic change, and the like.

DOCUMENTS OF PRIOR ART

[Patent Document 1]
Japanese Patent Application Laid-open No. 2004-274673: paragraph 0002, FIG. 12
[Patent Document 2]
Japanese Patent Application Laid-open No. 2007-295537: FIG. 1 to FIG. 12

DISCLOSURE OF THE INVENTION

The present invention was made under the above circumstances, and has an object to provide a frequency synthesizer capable of finely setting a frequency over a wide band and having a wide frequency pull-in range.

A frequency synthesizer according to the present invention includes:
  a voltage controlled oscillating part oscillating a frequency signal with a frequency that depends on a supplied voltage;
  an analog/digital converting part sampling a sine wave signal with a frequency corresponding to the output frequency of the voltage controlled oscillating part based on a reference clock signal and outputting a sampling value as a digital signal;
  a vector extracting means quadrature-detecting a frequency signal corresponding to the output signal from the analog/digital converting part by a digital signal of a sine wave signal whose frequency is $\omega 0/2\pi$, and extracting a real part and an imaginary part of complex expression of a vector rotating at a frequency equal to a frequency difference between a frequency of the frequency signal and $\omega 0/2\pi$;
  a parameter output part calculating a frequency of the vector obtained when the output frequency of the voltage controlled oscillating part becomes a set value;
  a frequency difference extracting means extracting a difference equal to the frequency of the vector from which the frequency calculated by the parameter output part is subtracted;
  a feedback means integrating a voltage signal corresponding to the frequency difference extracted by the frequency difference extracting means to feed an integration result as a control voltage back to the voltage controlled oscillating part via a digital/analog converting part;
  a frequency pull-in means which, during a period when the control voltage from the feedback means has a value larger than a prescribed set range, integrates a first constant for increasing the output frequency of the voltage controlled oscillating part to output an integration result as a frequency pull-in voltage via a second digital/analog converting part, and during a period when the control voltage from the feedback means has a value smaller than the set range, integrates a second constant for decreasing the output frequency of the voltage controlled oscillating part to output an integration result as the frequency pull-in voltage via the second digital/analog converting part; and an adding means adding the control voltage from the feedback means and the pull-in voltage from the frequency pull-in means to output an addition result as the control voltage for the voltage controlled oscillating part, wherein the voltage controlled oscillating part, the vector extracting means, and the feedback means feeding the voltage signal back to the voltage controlled oscillating part form a PLL, and when the PLL is locked, the output frequency of the voltage controlled oscillating part is adjusted to the set frequency.

The set range is within a range between an upper limit value and a lower limit value of an output of the control voltage from the feedback means.

The frequency synthesizer according to the present invention further includes:

a switch part disconnecting or connecting the frequency pull-in means from/to the adding means;

an initial voltage input means inputting, to said adding means, an initial voltage making the output frequency of the voltage controlled oscillating part lower than the set value, instead of outputting the pull-in voltage from the frequency pull-in means; and a switch control means controlling the switch part so as to disconnect the frequency pull-in means from the adding means at a timing, in an operation start period of the frequency synthesizer, before the initial voltage is input from the initial voltage input means, and so as to connect the frequency pull-in means to the adding means at a timing when the output of the control voltage from the feedback means to the voltage controlled oscillating part exceeds the upper limit value of the output of the control voltage from the feedback means after the initial voltage is input from the initial voltage input means.

In the frequency synthesizer according to the present invention, when the output from the feedback means deviates from the prescribed set range, the frequency pull-in means determines whether the output deviates from the set range toward an upper side or toward a lower side, and according to a result of the determination, the first constant for increasing the output frequency of the voltage controlled oscillating part or the second constant for decreasing the output frequency is integrated and the integration result is added to the output of the feedback means.

Therefore, for example, when a correspondence relation between the control voltage and the output frequency changes due to, for example, a change in ambient temperature of the voltage controlled oscillating part or the like and the control voltage from the feedback means greatly varies, the frequency is pulled in. Therefore, if, for example, the set range is set within a range narrower than the range between the upper limit value and the lower limit value of the output of the feedback means (control range of the PLL), there is no risk that the output of the feedback means deviates from the control range of the PLL, which makes it possible to obtain a stable output frequency.

BEST MODE FOR CARRYING OUT THE INVENTION

Figure 15:
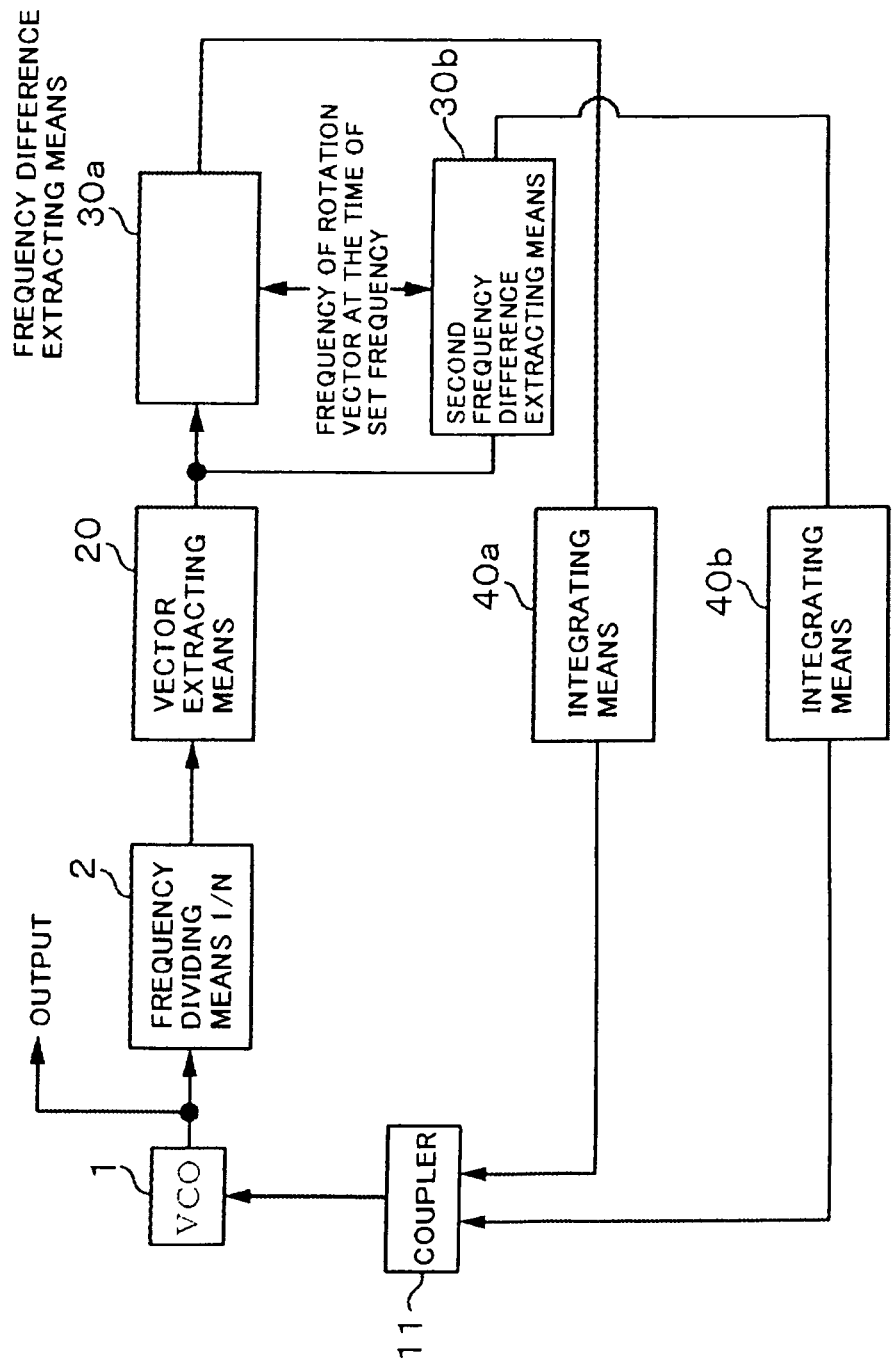
FIG. 15 is a block diagram showing the basic structure of a frequency synthesizer based on which the present invention is made.

A frequency synthesizer of the present invention operates based on a new principle, and therefore, an operation principle of a frequency synthesizer based on which the present invention is made will be first roughly described with reference to FIG. 15. In FIG. 15, 1 denotes a voltage controlled oscillator (VCO) being a voltage controlled oscillating part, which outputs a frequency signal being a rectangular wave with a frequency that depends on a supplied voltage. The frequency signal from the voltage controlled oscillator 1 is N-divided (N is an integer) by a frequency dividing means 2 and is further converted to a sinusoidal wave and to a digital signal, but here, it is only described that a vector extracting means 20 extracts a vector rotating at a frequency (velocity) that depends on the frequency of the frequency signal.

A first frequency difference extracting means 30a on a subsequent stage of the vector extracting means 20 extracts a difference between the frequency of the vector and a frequency fr of the vector obtained when the output frequency of the voltage controlled oscillator 1 becomes a set frequency. An example of a method of extracting the frequency difference is a method of generating a reverse vector rotating at the frequency fr in a direction opposite a rotation direction of the vector which is extracted by the vector extracting means 20 when the output frequency of the voltage controlled oscillator 1 becomes the set frequency, multiplying the vector and the reverse vector, and extracting a frequency difference.

Another possible method is to lower the frequency of the vector to some degree by a reverse vector and detect a difference of the remainder frequency as, for example, a velocity of the vector by an approximate expression. A more concrete example of such an example is to divide the adjustment for making the frequency of the vector match fr (an adjusting step of extracting the frequency difference by the first frequency difference extracting means 30a) into rough adjustment and fine adjustment. Then, among frequencies that are integral multiples of a resolution fa for the rough adjustment, a frequency n·fa (n is an integer) closest to the frequency of the vector obtained when the output frequency of the voltage controlled oscillator 1 becomes the set value is calculated in advance, the aforesaid vector is multiplied by a reverse vector reversely rotating at the frequency n·fa, and a very slow-velocity vector at a frequency equal to the frequency of the aforesaid vector from which the frequency of the reverse vector is subtracted is extracted. Then, among integral multiples of a resolution fb for fine adjustment that is smaller than the resolution fa, a frequency m·fb (m is an integer) closest to a difference between fr and the frequency n·fa is calculated, a difference between the frequency of the very slow-velocity vector and the frequency m·fb is extracted, and in this manner, a difference between the frequency of the vector obtained by the vector extracting means and fr is found.

The above series of calculations is performed by a not-shown parameter output part. Thus dividing the adjustment step of extracting the frequency difference into the rough adjustment and the fine adjustment has an advantage that an accurate frequency difference can be obtained when the frequency of the vector approaches fr, an advantage that the arithmetic operation for the frequency detection is simplified, and so on. This will become apparent from a later-described embodiment in FIG. 1 and FIG. 2.

Then, a voltage corresponding to the frequency difference extracted by the first frequency difference extracting means 30a is integrated by an integrating means 40a forming part of a feedback means, and an integration result is supplied to an input side of the voltage controlled oscillator 1. Therefore, the loop in FIG. 15 forms a PLL, and when the frequency difference becomes zero, the PLL is locked and the output frequency of the voltage controlled oscillator 1 is locked at the set frequency.

Incidentally, the first frequency difference extracting means 30a has high resolution in order to make the frequency of the vector match fr as described above, but is capable of extracting the frequency difference only in a relatively narrow range. Therefore, in the frequency synthesizer shown in FIG. 15, when the frequency difference is large, for example, at the operation start time or the like, since a voltage high enough to operate the first frequency difference extracting means 30a cannot be obtained, in other words, since the output frequency of the voltage controlled oscillator 1 is small, the control voltage to the voltage controlled oscillator 1 is not sometimes sufficient. Therefore, it is thought that advantageous methods are: (1) a method to increase the output frequency of the voltage controlled oscillator 1 at the initial period of the operation start by generating a control voltage from a circuit for control voltage generation including an integration circuit part; (2) a method to provide a second frequency difference extracting means 30b for frequency pull-in which has lower resolution than that of the first frequency difference extracting means 30a and has a range that enables the output of the control voltage even when the frequency difference is large; and the like.

For example, the frequency synthesizer shown in FIG. 15 adopts the method (2) and includes the second frequency difference extracting means 30b having lower resolution than that of the first frequency difference extracting means 30a and having a wide range enabling the output of the control voltage. At the operation start time, the control voltage corresponding to the frequency difference extracted by the second frequency difference extracting means 30b is output, and this control voltage is integrated by an integrating means 40b and the integration result is given as the control voltage for the voltage controlled oscillator 1, so that the output frequency increases.

After this frequency falls within the range of the first frequency difference extracting means 30a, a difference (frequency difference) between the pre-calculated frequency fr of the vector obtained when the output frequency of the voltage controlled oscillator 1 becomes the set frequency and the frequency of the vector extracted by the vector extracting means 20 becomes smaller. Therefore, the operation of the integrating means 40b on the subsequent stage of the second frequency difference extracting means 30b is stopped, thereby setting the control voltage to a fixed value, and a voltage corresponding to the frequency difference from the first frequency difference extracting means 30a is integrated, and the integration result is given as the control voltage to the voltage controlled oscillator 1. As a result, an increase ratio of the output frequency of the voltage controlled oscillator 1 also becomes small, and an increase ratio of the integration value of the frequency difference also gradually becomes smaller. Accordingly, the way the output frequency of the voltage controlled oscillator 1 increases becomes further slower, and accordingly, the way the integration value of the voltage corresponding to the frequency difference increases also becomes slower. Soon, the output frequency settles at the set frequency, and the PLL loop is locked.

Actually, since the frequency divider ratio may be selected according to the magnitude of the set frequency, adopting an idea of the vector makes it possible to finely set the frequency over a wide frequency band even with only the single-stage PLL.

However, the frequency synthesizer according to FIG. 15 has a problem that the number of components increases since it uses the two frequency difference extracting means 30a, 30b different in resolution. As will be described later, the frequency difference extracting means each need to have a plurality of multipliers and adders, and actually, a plurality of FPGAs (Field Programmable Gate Arrays) including several ten thousand gates have to be incorporated.

To solve such a problem, the present inventor studied how a frequency synthesizer should be structured in order to be capable of executing the frequency pull-in operation at the operation start time or the like without having the second frequency difference extracting means 30b for frequency pull-in. As a result, the pull-in operation without using a low-resolution frequency difference extracting means was achieved by such a structure that, when an output of an integrating means having a range corresponding to a control range of PLL varies to deviate from a prescribed set range, it is detected whether the deviation of the output is in a direction to a larger side or to a smaller side of the set range, and this detection result is utilized. Hereinafter, the structure of a frequency synthesizer according to this embodiment will be described in detail.

Figure 1:
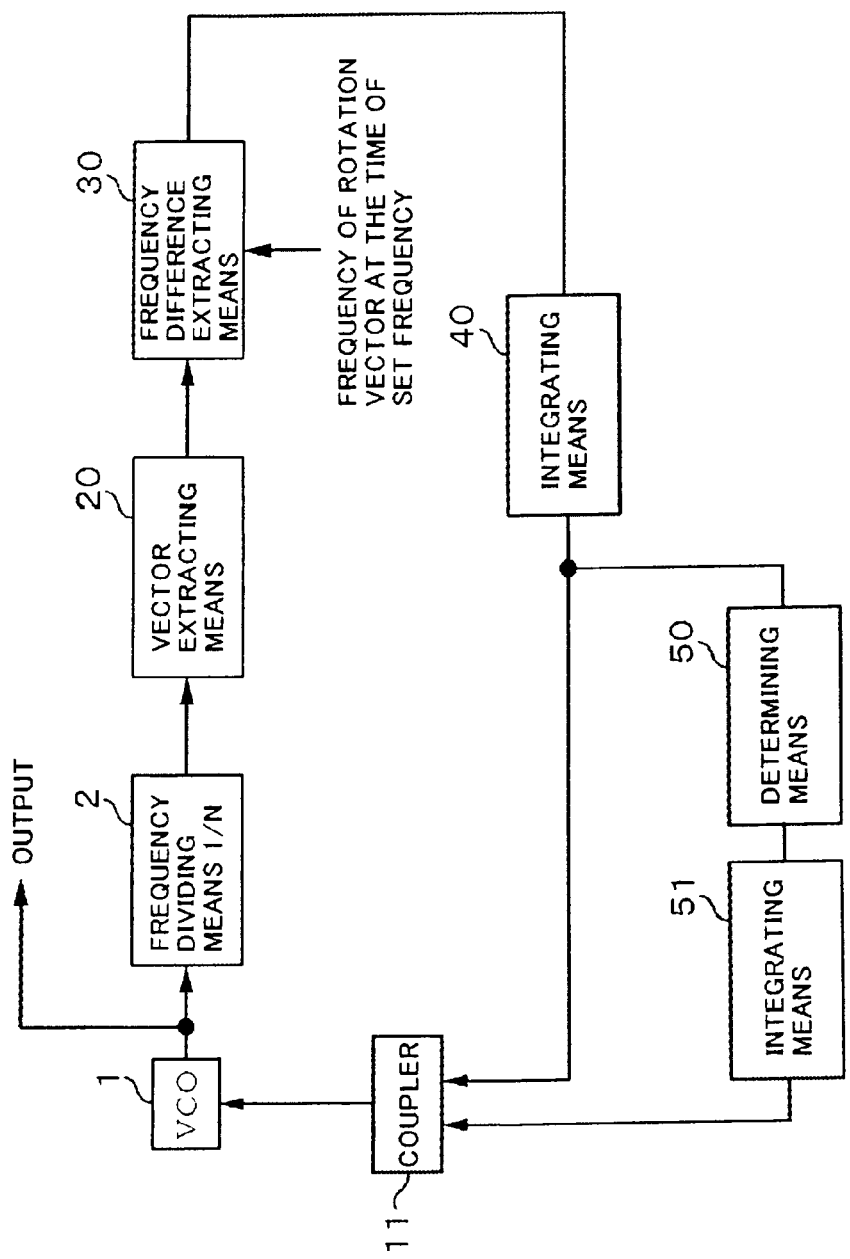
FIG. 1 is a block diagram showing the basic structure of a frequency synthesizer according to the present invention.

FIG. 1 shows a rough structure of the frequency synthesizer according to this embodiment. The structure and function of a loop of a voltage controlled oscillator 1→a frequency dividing means 2→a vector extracting means 20→a frequency difference extracting means 30→an integrating means 40 are the same as those of the frequency synthesizer shown in FIG. 15. Note that the frequency difference extracting means 30 and the integrating means 40 in FIG. 1 correspond to the first frequency difference extracting means 30a and the integrating means 40a in FIG. 15 respectively.

What makes the frequency synthesizer according to this embodiment different from the aforesaid frequency synthesizer which performs the frequency pull-in operation by using the second frequency difference extracting means 30*b* with low resolution is that, as the frequency pull-in means performing the pull-in operation at the operation start time, a determining means 50 and an integrating means 51 integrating an output from the determining means to output the integration result to the voltage controlled oscillator 1 are provided on a subsequent stage of the integrating means 40. Hereinafter, a concrete structure example of the frequency synthesizer including the above structure will be described with reference to the drawings starting from FIG. 2.

The means provided on the subsequent stages of the voltage controlled oscillator 1 will be described in sequence. 2 denotes a frequency divider formed by, for example, a programmable counter, and a frequency divider ratio N (N is an integer) of the frequency divider 2 is decided by a later-described parameter output part. On a subsequent stage of the frequency divider 2, a low-pass filer 21 is provided as a means for converting a rectangular wave signal being a frequency signal of the frequency divider 2 into a sine wave signal.

Figure 2:
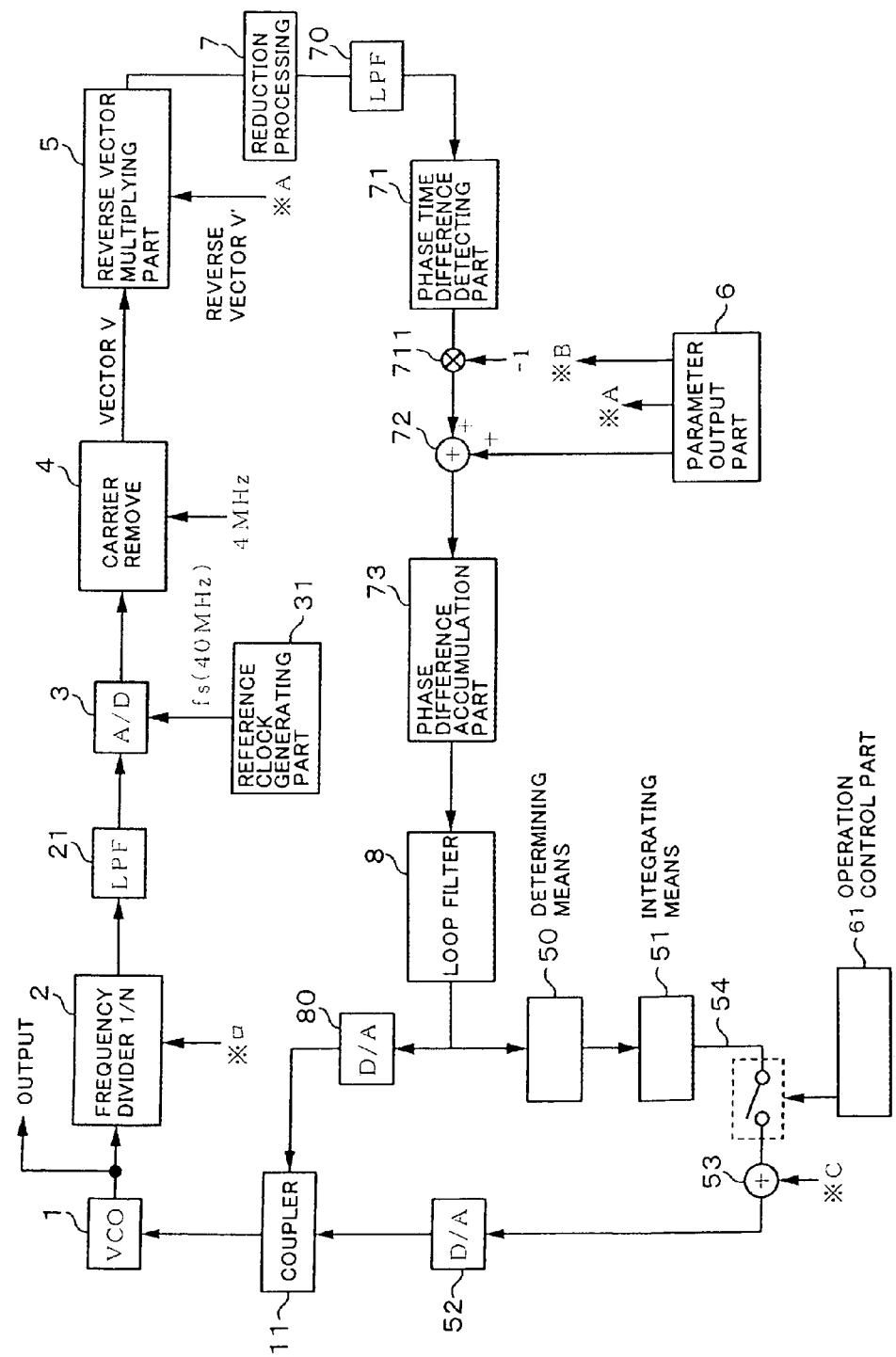
FIG. 2 is a block diagram showing an embodiment of the frequency synthesizer according to the present invention.

3 in FIG. 2 denotes an A/D (analog/digital) converter, which samples the sine wave signal being a frequency signal from the low-pass filer 21, based on a clock signal from a reference clock generating part 31 to output a sampling value as a digital signal. The reference clock generating part 31 outputs the clock signal which is a frequency signal having a very stable frequency in order to be used in the sampling of the frequency signal.

A high-frequency signal specified by the digital signal obtained in the A/D converter 3 includes not only a fundamental but also other harmonics. That is, when a sinusoidal wave having a harmonic distortion is sampled, it is expected that the harmonic components are influenced by folding and in some case, a fundamental frequency and harmonic frequencies overlap with each other on a frequency axis in a frequency spectrum. Therefore, it is necessary to avoid such overlapping and extract a vector accurately corresponding to the output frequency of the voltage controlled oscillator 1 later.

Generally, when a sine wave signal with a frequency f1 is sampled based on a clock signal with a frequency fs, a frequency f2 of the sampling result is expressed by an expression (1), where mod(,) represents a modulo function.

$$f2=|\mathrm{mod}(f1+fs/2,fs)-fs/2| \quad (1)$$

In this sampling result, since a frequency of an n-order harmonic of the fundamental frequency is expressed as n×(fundamental frequency), substituting this for f2 in the above expression (1) makes it possible to calculate what frequency the extracted harmonic has. By using this calculation, it is possible to set a frequency fc of the high-frequency signal from the frequency divider 2 and the sampling frequency (frequency of the clock signal) fs so that the frequency of the fundamental and the frequency of the harmonic do not overlap. For example, when the frequency divider ratio N is set so that fc when the vector stops becomes 36 MHz and fs is set to 40 MHz, the fundamental of the frequency signal specified by the output signal being the digital signal from the A/D converter 3 becomes a 4 MHz sinusoidal wave. Incidentally, if fc/fs is set to 9/10, the frequency of the fundamental and the frequencies of the harmonics do not overlap, but fc/fs is not limited to this value.

On a subsequent stage of the A/D converter 3, a carrier remove 4 is provided. The carrier remove 4 corresponds to a means for quadrature-detecting the sine wave signal specified by the digital signal from the A/D converter 3 by a sine wave signal whose frequency is ω0t/2π (angular velocity is ω0t) and extracting a vector rotating at a frequency equal to a difference between the frequency of the frequency signal specified by the digital signal of the A/D converter 3 and the frequency of the sine wave signal used for the detection, more specifically, corresponds to the vector extracting means 20 shown in FIG. 1 that extracts a real part and an imaginary part of the complex expression of the vector.

Figure 3:
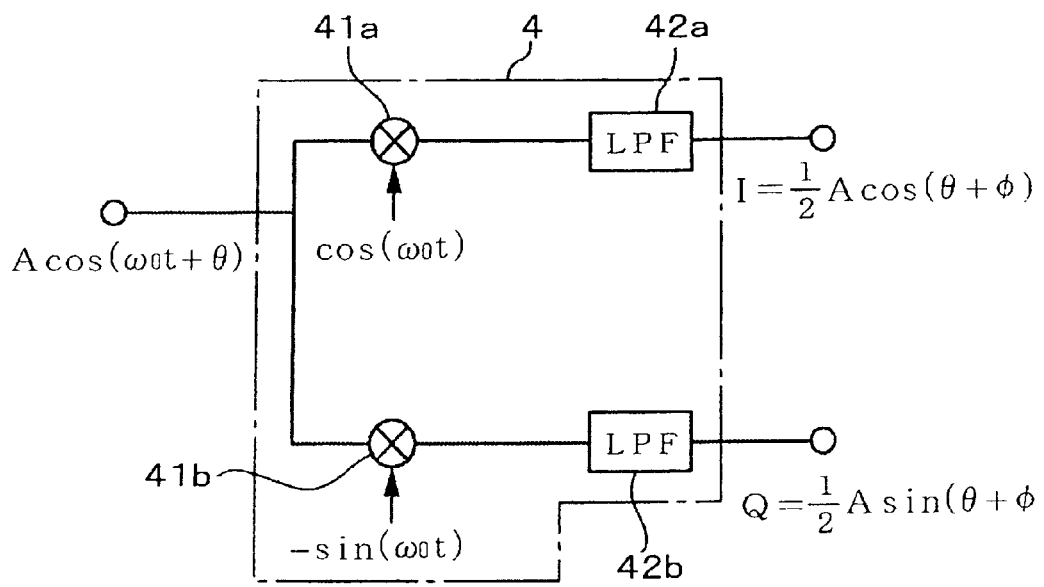
FIG. 3 is a block diagram showing a carrier remove used in the above embodiment.

The carrier remove 4 will be described in detail. As shown in FIG. 3, the carrier remove 4 includes: a multiplying part 41*a* multiplying the sine wave signal by cos(ω0t), a multiplying part 41*b* multiplying the sine wave signal by −sin(ω0t); and low-pass filters 42*a*, 42*b* provided on subsequent stages of the multiplying parts 41*a*, 41*b* respectively. Therefore, an output of the multiplying part 41*a* and an output of the multiplying part 41*b* are expressed by an expression (2) and an expression (3) respectively, where A cos(ω0t+θ) is the sine wave signal obtained in the A/D converter 3.

$$A\cos(\omega 0t+\theta)\cdot\cos(\omega 0t)=\tfrac{1}{2}\cdot A\cos\theta+\tfrac{1}{2}\{\cos(2\omega 0t)\cdot\cos\theta+\sin(2\omega 0t)\cdot\sin\theta\} \quad (2)$$

$$A\cos(\omega 0t+\theta)\cdot-\sin(\omega 0t)=\tfrac{1}{2}\cdot A\sin\theta-\tfrac{1}{2}\{\sin(2\omega 0t)\cdot\cos\theta+\cos(2\omega 0t)\cdot\sin\theta\} \quad (3)$$

Then, after the output of the multiplying part 41*a* and the output of the multiplying part 41*b* pass through the low-pass filters 42*a*, 42*b* respectively, a frequency signal of 2ω0t is removed, so that ½·A cos θ and ½·A sin θ are extracted from the low-pass filters 42*a*, 42*b* respectively. Actual digital processing in the low-pass filters 42*a*, 42*b* calculates a moving average of a plurality of continuous data, for example, six data, in time-series data output from each of the multiplying parts 41*a*, 41*b*.

From the above, it follows that, when the frequency of the sine wave signal obtained in the A/D converter 3 is equal to the frequency of the sine wave signal used in the quadrature detection, no time function is contained in the outputs and thus the vector obtained in the carrier remove 4 is stopped. On the other hand, when the frequency of the sine wave signal expressed by A cos(ω0t+θ) changes, A cos(ω0t+θ) becomes A cos(ω0t+θ+ω1t). Therefore, ½·A cos θ becomes ½A cos (θ+ω1t), and ½·A sin θ becomes ½A sin(θ+ω1t). That is, the outputs obtained from the low-pass filters 42*a*, 42*b* are signals corresponding to a variation (ω1t) of the frequency of the sine wave signal [A cos(ω0t+θ)], that is, a real part (I) and an imaginary part (Q) of the complex expression of the vector rotating at a velocity equal to a difference (ω1t/2π) between the frequency of the sine wave signal obtained in the A/D converter 3 and the frequency of the sine wave signal used in the quadrature detection. Note that, in this specification, the frequency and the angular velocity are mixedly used because there is no significance in discriminately using the both.

Figure 4:
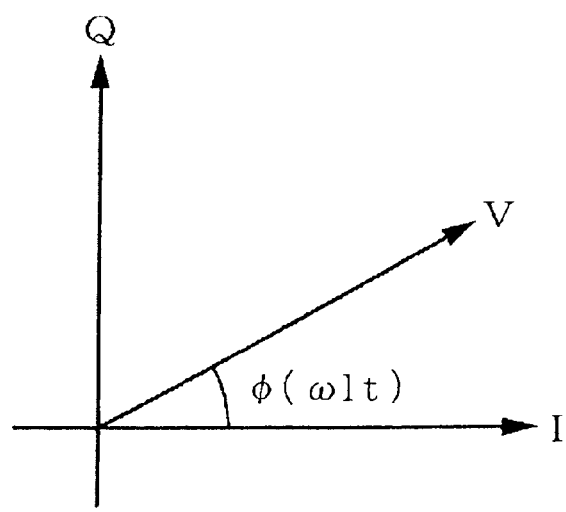
FIG. 4 is an explanatory chart showing a vector obtained in the carrier remove.

FIG. 4 is a chart showing this vector V, and a length of the vector V is A and its rotation velocity is ω1t (=φ)) (the frequency is ω1t/2π). In this example, the frequency used in the quadrature detection is 4 MHz, and when the frequency of the sine wave signal obtained in the A/D converter 3 is 4 MHz, the rotation velocity of the vector is zero, but if the frequency deviates from 4 MHz, the vector rotates at a frequency (rotation velocity) corresponding to the frequency difference corresponding to the deviation.

On a subsequent stage of the carrier remove 4, a reverse vector multiplying part 5 is provided. The reverse vector multiplying part 5 multiplies the vector V obtained in the carrier remove 4 by a reverse vector V' generated by the parameter output part 6. In an intuitive expression, this multiplication reduces the velocity of the vector V by the velocity of the reverse vector V', and in other words, generates a vector rotating at a difference between the frequency of the vector V and the frequency of the reverse vector V'.

The arithmetic operation in the reverse vector multiplying part 5 will be described. The carrier remove 4 and the reverse vector multiplying part 5 are executed by the arithmetic operation of a computer, and assuming that a sampling value of the vector V in a sampling at a given timing, for example, in an n-th sampling in the sampling of the arithmetic operation is I(n)+jQ(n), an n-th sampling value of the reverse vector V' is I'(n)+jQ'(n). A vector I+jQ being the result of the multiplication of the both vectors is {I(n)+jQ(n)}×{I'(n)+jQ'(n)}. Summarizing this expression gives an expression (4).

$$I+jQ=\{I(n)\cdot I'(n)-Q(n)\cdot Q'(n)\}+j\{I(n)\cdot Q'(n)+I'(n)\cdot Q(n)\} \quad (4)$$

Figure 5:
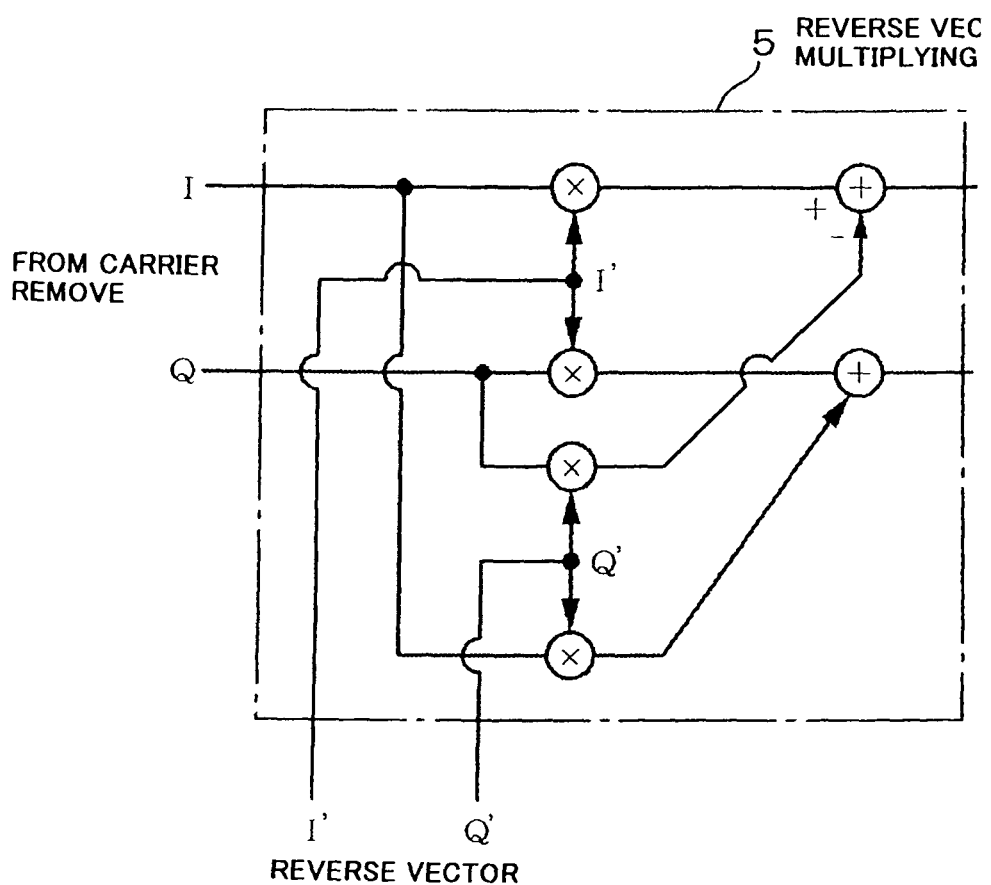
FIG. 5 is a block diagram showing the structure of a reverse vector multiplying part.

FIG. 5 shows the structure of the reverse vector multiplying part 5, which performs the arithmetic operation of the expression (4).

Figure 6:
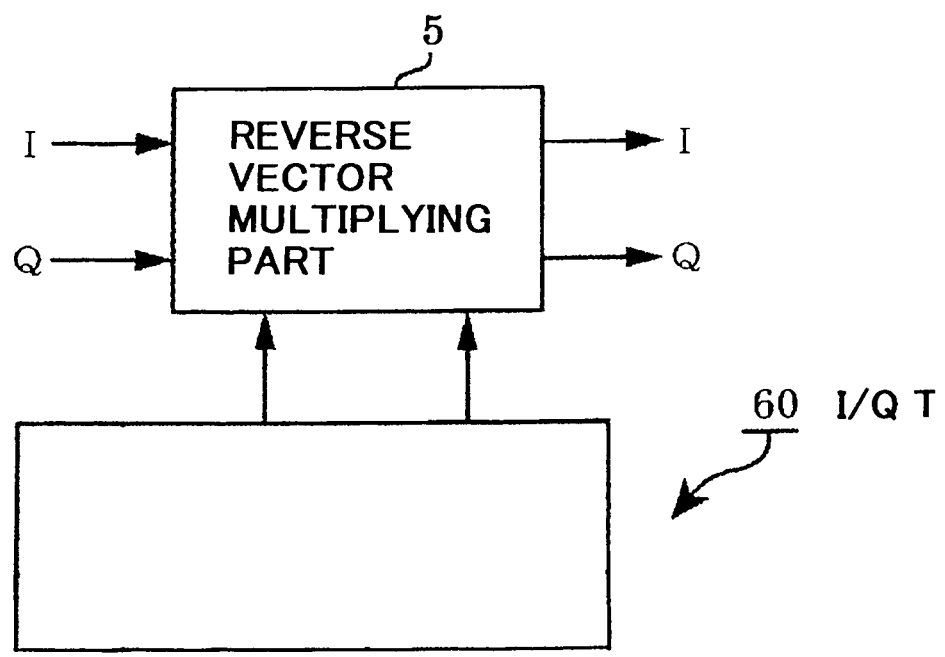
FIG. 6 is an explanatory chart showing a data table for generating a reverse vector in a parameter generating part.

That the reverse vector V' is generated actually means that values of the real part and the imaginary part, that is, values of cos φ' and sin φ' are generated so that the vector reversely rotates on a complex plane, φ' being a phase of the reverse vector V'. FIG. 6 shows an I/Q table 60 in which pairs of cos φ' and sin φ' of the vector are arranged in order along a rotation direction of the vector, and in this example, the parameter output part 6 includes the I/Q table 60 and reads addresses in the I/Q table 60 by an increment number or a decrement number decided according to the designated set frequency of the voltage controlled oscillator 1 to output the read result to the reverse vector multiplying part 5. For example, when a 0-th address to a k-th address are read one by one at read timings of the clock, the vector V rotates at a certain velocity, and when every other address is read by setting the increment number to 2, the velocity of the vector is doubled. Whether to increment or decrement the number in reading can be decided according to the rotation direction of the vector V extracted by the carrier remove 4. In this manner, the reverse vector V' reversely rotating relative to the vector V can be generated.

A series of the arithmetic operations in the blocks up to here in FIG. 2 will be concretely described. The frequency after the frequency division by the frequency divider 2 is fvco/N, where fcvo is the output frequency of the voltage controlled oscillator 1. The sampling in the A/D converting part 3 is based on the clock signal whose frequency is fs, and therefore, the frequency of the frequency signal specified by the digital signal obtained in the A/D converting part 3 is fs−(fvco/N). In this example, this frequency is 40 MHz −(fvco/N) because fs is 40 MHz. Then, since the frequency (ω0t/2π) of the sine wave signal used in the detection in the carrier remove 4 is 4 MHz, the frequency of the vector V extracted from the carrier remove 4 is 40 MHz−(fvco/N)−4 MHz.

In this invention, the control is performed so that the frequency difference between the frequency of the vector V and the frequency fr becomes zero when the output frequency fvco of the voltage controlled oscillator 1 becomes the set frequency. If (fvco/N) is 36 MHz, the vector V is stopping (frequency is zero), and therefore, by setting the frequency of the reverse vector V' to zero in this case, the PLL is locked and the output frequency fvco of the voltage controlled oscillator 1 becomes the set frequency. However, since such a case occurs only at one point, the vector V extracted from the carrier remove 4 actually rotates at a certain velocity. Therefore, it is necessary to generate the reverse vector V' for stopping the vector V, but since the series of calculations is executed by software, it is a requirement in designing that a memory capacity storing data for generating the reverse vector V' be as small as possible.

From this view point, fse/N, fse being the set frequency of the voltage controlled oscillator 1, is preferably as close to 36 MHz as possible, and in this example, the parameter output part 6 calculates an integer with which fset/N becomes the closest to 36 MHz when the desired set frequency set by a user is fset, and this integer is used as the frequency divider ratio N of the frequency divider 2. As a result, the frequency of the reverse vector V' for stopping the vector V extracted from the carrier remove 4 has a value smaller than 4 MHz, which can reduce a data volume for generating the reverse vector V.

Here, a concrete example of the frequency will be described. If the set frequency fset of the voltage controlled oscillator 1 is, for example, 520.0001 MHz, the frequency divider ratio N, which is set to an integer closest to, for example, fset/36 MHz, is N=14. In this case, the post-division frequency obtained when the output frequency of the voltage controlled oscillator is the set frequency fset is fset/14=37.1428642857143 MHz. As described above, when the post-division frequency is 36 MHz, the frequency of the frequency signal specified by the digital value obtained in the A/D converting part 3 is 40 MHz−36 MHz=4 MHz, and the frequency of the vector V obtained through the carrier remove 4 performing the quadrature detection by the 4 MHz sine wave signal is 4 MHz−4 MHz=0, which means that the vector V stops. Therefore, the frequency signal with fset/14=37.1428642857143 MHz is converted to a digital value in the A/D converting part 3, and the frequency of the vector V obtained when this frequency signal is input to the carrier remove 4 is 37.1428642857143 MHz−36 MHz=1.1428642857143 MHz.

Such arithmetic operation is performed by the parameter output part 6 before the voltage controlled oscillator 1 is operated, in response to the input of the set frequency to the frequency synthesizer. Further, the parameter output part 6 refers to a not-shown memory to select a voltage value with which the frequency close to the set frequency is obtained, so that the output voltage of the coupler 11 increases toward this voltage value. Then, when the frequency divider ratio N is set to 14 and the frequency of the reverse vector V' is set to 1.1428642857143 MHz, the output frequency fvco of the voltage controlled oscillator 1 increases until the frequency of the frequency signal obtained in the A/D converting part 3 becomes 1.1428642857143 MHz, and after a while, when the frequency of the vector V matches the frequency of the reverse vector V', the PLL is locked and fvco converges in fset.

Figure 7:
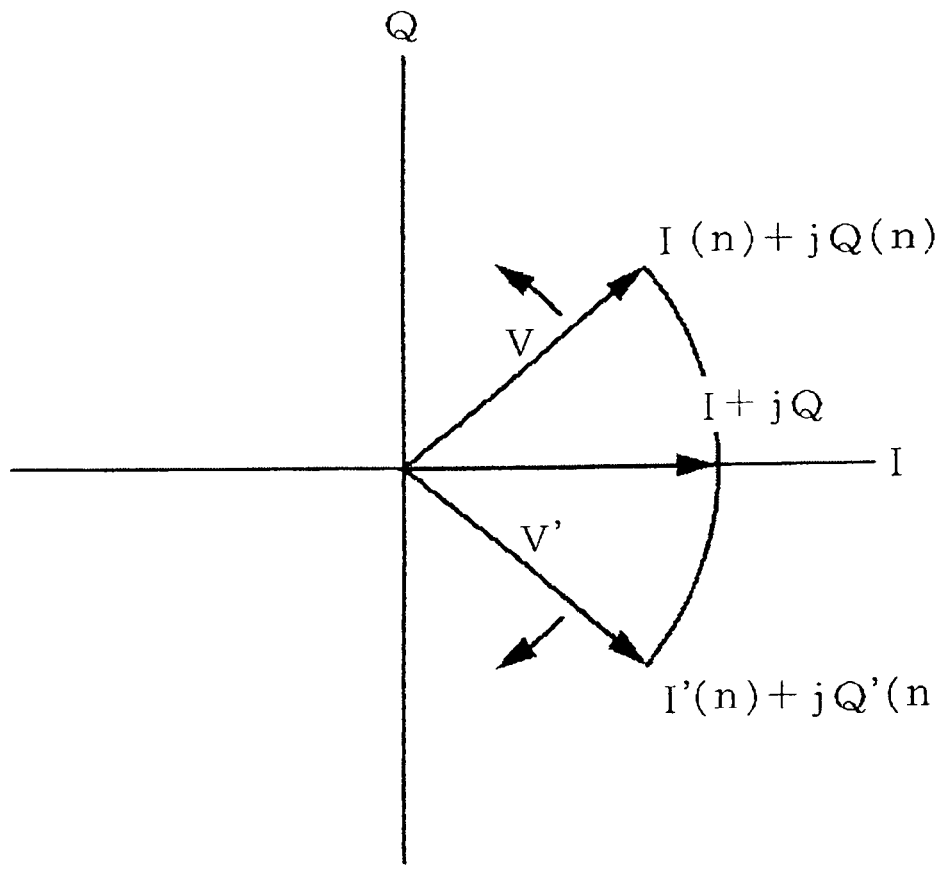
FIG. 7 is an explanatory chart showing a state where the vector obtained in the carrier remove and the reverse vector are multiplied by each other by a frequency difference extracting means.

FIG. 7 is a chart showing an image of a state where the vector V is stopped by being subjected to reverse rotation processing by the reverse vector V'.

Incidentally, the above operation is the operation of a type in which the stopping of the vector V relies only on the reverse vector V', and in this case, it is only necessary to input a signal corresponding to the frequency of the vector obtained in the reverse vector multiplying part 5 to a loop filter 8. However, in such a structure, a data volume for generating the reverse vector V' becomes considerably large. Therefore, in the embodiment shown in FIG. 2, the frequency of the vector V is reduced to a certain degree by the reverse vector V', and the velocity reduction of the remainder frequency is assigned to the operation of a phase time difference detecting part 71, an adding part 72, and a phase difference accumulation part 73 which are provided on subsequent stages. In other words, the vector V is stopped by the rough adjustment of the frequency of the vector V in the reverse vector multiplying part 5 and the fine adjustment of the vector V on the subsequent stages.

The frequency of the reverse vector V' for the rough adjustment of the frequency of the vector V can be set in, for example, 152.587890625 Hz increments. The reason is that, when data is sampled by 40 MHz, if the number of points of the phase of the reverse vector V' is set to 2 raised to the 18th power, 40 MHz/2 raised to the 18th power=152.587890625 Hz. That is, in the parameter output part 6, the minimum rough adjustment frequency (resolution fa) is 152.587890625 Hz, and it is calculated by what number the resolution fa should be multiplied in order to obtain a value closest to 1142864.2857143 Hz (1.1428642857143 MHz) which is the frequency of the aforesaid vector V.

An integer closest to 1142864.2857143 Hz/152.587890625 Hz is 7490, and the parameter output part 6 finds this integer to find the frequency n·fa (n is an integer)=7490·152.587890625 Hz=1142883.30078125 Hz closest to the frequency of the vector V obtained when the output frequency of the voltage controlled oscillator 1 becomes the set value.

Then, the parameter output part 6 calculates the following. First, the frequency for the adjustment by the reverse vector V' is subtracted from the frequency of the vector V to find 1142864.2857143 Hz−1142883.30078125 Hz=19.0150669664145 Hz.

Further, among integral multiples of the resolution fb, in this example, a resolution 1 Hz, for the fine adjustment smaller than the resolution fa for the rough adjustment, a frequency m·fb (m is an integer) closest to 19.0150669664145 Hz which is a difference between the frequency of the vector V obtained when the output frequency of the voltage controlled oscillator 1 becomes the set value and the frequency n·fa is calculated. In this case, since fb is 1 Hz, m is 19, and the adjustment by 19 Hz is performed by the parts on the subsequent stages of the reverse vector multiplying part 5. Note that the terms, rough adjustment and fine adjustment mentioned here, are different from rough adjustment based on the output of the determining means 50 side and fine adjustment based on the output of the frequency difference extracting means 30 side, which are shown in FIG. 1, in the feedback means which is a modified part of the frequency synthesizer of this new type.

Returning to FIG. 2, 7 denotes a reduction processing part, 70 denotes a low-pass filter, 71 denotes a phase time difference detecting part, 72 denotes a second adding part, 73 denotes a phase difference accumulation part, 8 denotes a loop filter, and 80 denotes a D/A (digital/analog) converting part.

Figure 8:
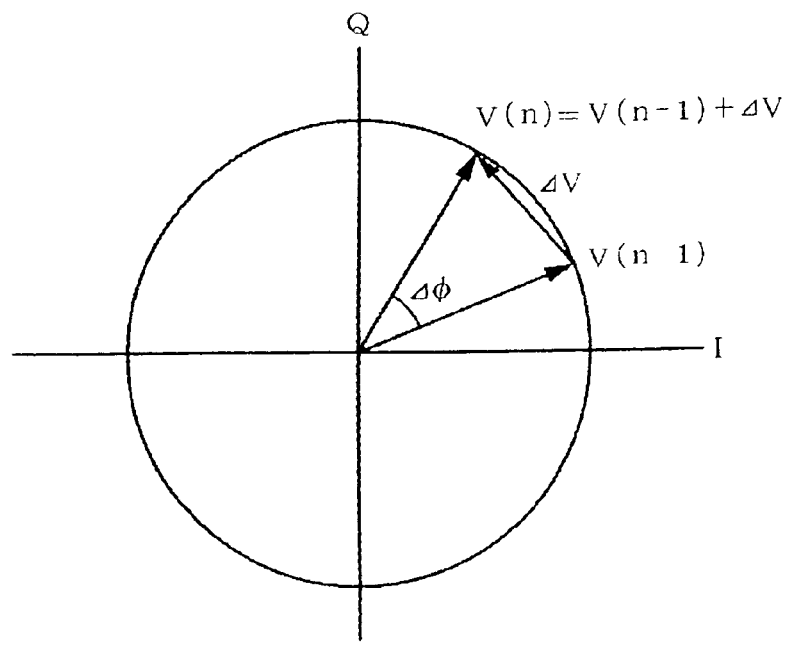
FIG. 8 is an explanatory chart showing a phase difference between vectors sampled at consecutive timings.

Since the rotation velocity of the vector V has been reduced by the reverse vector V', the frequency (velocity) of the vector V can be found by a simple approximate expression. As shown in FIG. 8, on a complex plane, an angle Δϕ made by a vector V(n−1) obtained by an (n−1)-th sampling and a vector V(n)=V(n−1)+ΔV obtained by an n-th sampling, that is, a phase difference Δϕ between the vectors V obtained by the both samplings can be regarded as a length of ΔV if the frequency of the vector V is sufficiently smaller than the sampling frequency and θ=sin θ roughly holds.

The approximate expression for finding ΔV will be described. First, the phase difference Δϕ is expressed by an expression (5). In the expression, imag is an imaginary part, conj{V(n)} is a conjugate vector of V(n), and K is a constant.

$$\Delta\phi = K \cdot \mathrm{imag}[\Delta V \cdot \mathrm{conj}\{V(n)\}] \quad (5)$$

Here, if an I value (a real part of the vector V) and a Q value (an imaginary part of the vector V) corresponding to the n-th sampling are I(n) and Q(n) respectively, ΔV and conj{V(n)} in the complex expression are expressed by an expression (6) and an expression (7) respectively.

$$\Delta V = \Delta I + j \Delta Q \quad (6)$$

$$\mathrm{conj}\{V(n)\} = I(n) - jQ(n) \quad (7)$$

ΔI is I(n)−I(n−1) and ΔQ is Q(n)−Q(n−1). As a result of substituting the expression (6) and the expression (7) in the expression (5) and summarizing the expression, Δϕ is expressed by an expression (8).

$$\Delta\phi = \Delta Q \cdot I(n) - \Delta I \cdot Q(n) \quad (8)$$

The phase time difference detecting part 71 thus has a function of finding Δϕ by using the approximate expression. Since this Δϕ is a value corresponding to the frequency of the vector V whose velocity is reduced in the reverse vector multiplying part 5, the phase time difference detecting part 71 can be said to be a means outputting the frequency of the vector whose velocity is reduced (very slow vector detecting means).

Incidentally, after the vector V(n−1) and V(n) are found, any of various mathematical methods can be used as a method of finding the angle Δϕ therebetween, and the approximate expression (5) is only an example thereof. As the mathematical expression, by using {V(n)+V(n−1)}/2 which is a vector V0 connecting a mid point of a line connecting end points of V(n) and V(n−1) and an origin, the vector V0 may be substituted in V(n) of the expression (5). The reason why the expression (5) can be thus approximated is that V0 and ΔV can be regarded as being orthogonal to each other and the length ΔV can be handled as corresponding to an imaginary value of ΔV when V0 is regarded as a real axis.

Since the parameter output part 6 finds a value of 19 Hz corresponding to the frequency fine adjustment amount of the vector V by the calculation, the frequency of the vector V detected by the phase time difference detecting part 71 and 19 Hz corresponding to the fine adjustment amount are compared by the adding part 72, a difference between the frequency of the vector V and the 19 Hz fine adjustment amount is extracted, and the difference is input to the phase difference accumulation part 73. Then, an output value from the phase difference accumulation part 73 is input to the loop filter 8.

In the present invention, the processing for stopping the vector V is performed as shown in FIG. 7, but in the example in FIG. 2, this processing is divided into rough stop processing by what is called reverse rotation and processing for accurately stopping the vector V whose velocity has become very slow, and the latter processing is assigned to the phase time difference detecting part 71 and the adding part 72. Then, the reverse vector multiplying part 5, the phase time difference detecting part 71, and the second adding part 72 correspond to the frequency difference extracting means 30 shown in FIG. 1. Incidentally, in this example, when the output frequency of the voltage controlled oscillator 1 is lower than the set frequency, that is, when the frequency of the rotation vector is lower than the set frequency, the output of the phase time difference detecting part 71 becomes a negative value, and therefore, a multiplying part 711 multiplying this output by −1 is provided.

Figure 9:
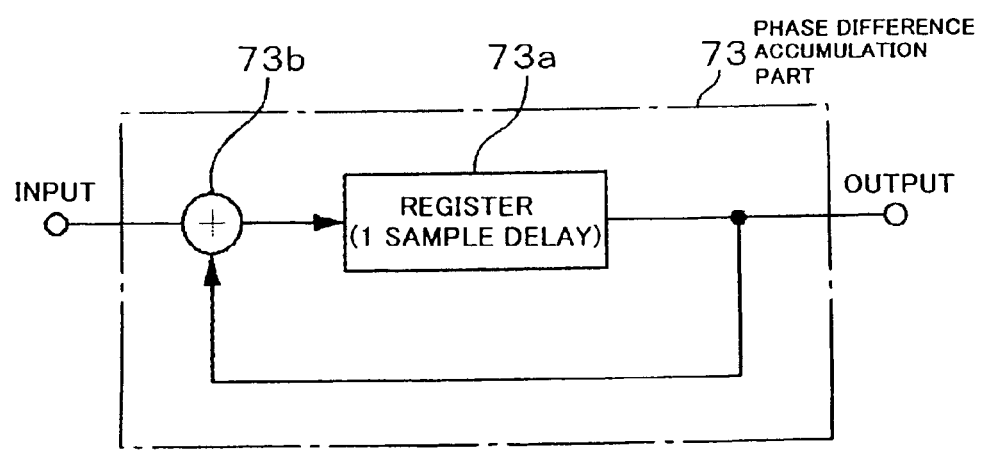
FIG. 9 is a block diagram showing a phase difference accumulation part in the block diagram in FIG. 2.

As shown in FIG. 9, the phase difference accumulation part 73 holds the input value at the time of a given sampling in a register 73a, and at the next sampling, it not only outputs the value held until then but also returns this value to an adding part 73b to add the value to the input value, and inputs the addition value to the register 73a.

Figure 10:
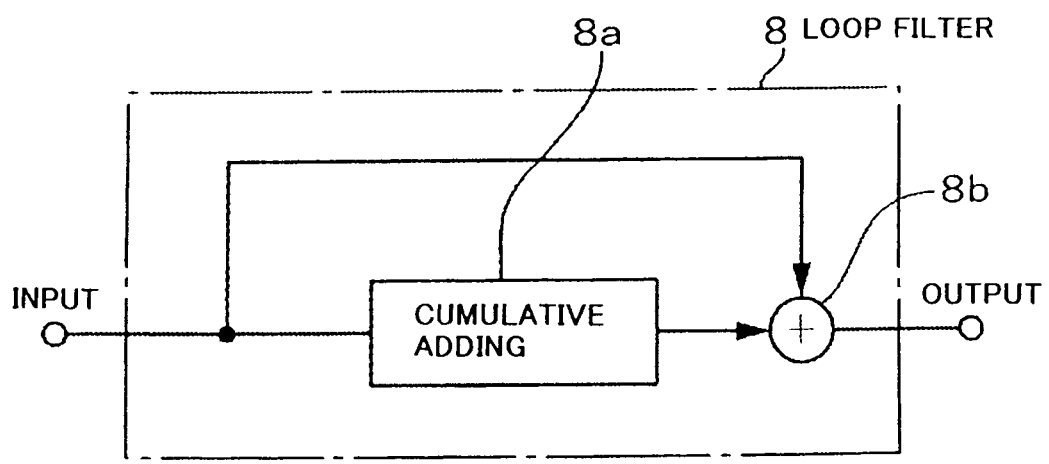
FIG. 10 is a block diagram showing a loop filter in the block diagram in FIG. 2.

Further, the loop filter 8, which corresponds to the integrating means 40 in FIG. 1, is configured to cumulatively adding the input values in a cumulative adding part 8a and add the cumulative addition value and the input value in an adding part 8b as shown in FIG. 10. An output voltage of the loop filter 8 is converted to an analog voltage by the D/A converting part 80, and is added in a coupler 11 to the output voltage from a D/A converting part of a later-described frequency pull-in means, and the addition value is input as a control voltage to the voltage controlled oscillator 1. The loop filter 8 also plays a role of reducing signal fluctuation and stabilizing the loop. In this example, the phase difference accumulation part 73, the loop filter 8, and the D/A converting part 80 correspond to a feedback means.

The loop from the voltage controlled oscillator 1 back to the voltage controlled oscillator 1 via the frequency difference extracting means and the loop filter 8 forms a PLL. Further, parts from the A/D converter 3 to the loop filter 8 are each formed by a digital processing device such as FPGA.

Here, regarding the above-described pull-in operation, the present inventor studied a relation between a detection value of the phase time difference detecting part 71 and an output level of the low-pass filter 21 and has found out that a gain of the low-pass filter 21 decreases when the output frequency of the voltage controlled oscillator 1 deviates from a predetermined frequency range which is set around a point of the set frequency. When the output frequency of the voltage controlled oscillator 1 changes to deviate from this range due to a temperature characteristic or the like, a control system does not follow this change and thus the frequency cannot be pulled in to the set frequency. Further, at the operation start time of the device, since the control voltage has not been input to the voltage controlled oscillator 1, it is necessary to raise the control voltage up to the frequency pull-in range.

For this purpose, the frequency synthesizer according to this embodiment includes as the frequency pull-in means: the determining means 50 determining whether or not the output of the loop filter 8 deviates from the preset range and outputting a constant for adjusting the output frequency of the voltage controlled oscillator 1 according to the determination result; and the integrating means 51 integrating the output from the determining means 50 and outputting the integration result to the voltage controlled oscillator 1. Further, on a subsequent stage of the integrating means 51, there are provided: a switch 54 disconnecting the frequency pull-in means from the coupler 11 at the operation start time of the frequency synthesizer; an adding part 53 being an initial voltage input means inputting an initial voltage of the voltage controlled oscillator 1 at the operation start time; and the D/A converting part 52 converting a digital signal from each of the integrating means 51 and the adding part 53 into the control voltage (analog signal) for the voltage controlled oscillator 1. Here, "ON/OFF" of the switch 54 is switched by an operation control part 61 being a switch control means. The operation control part 61 has a function of monitoring the output of the loop filter 8, and when the output is fixed at the upper limit of the range, turning on the switch 54 to connect the frequency pull-in means to the coupler 11.

Figure 11:
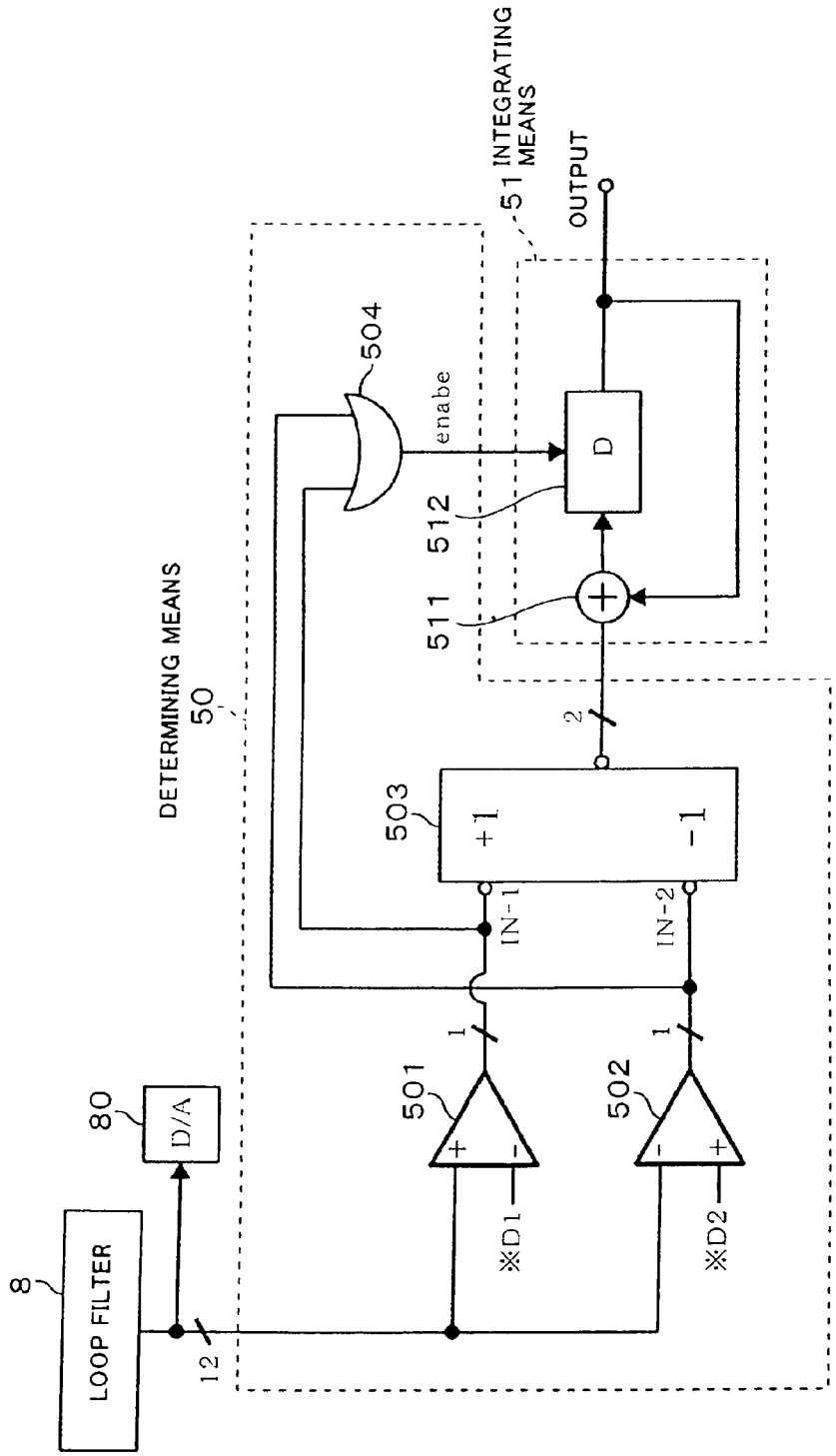
FIG. 11 is a block diagram showing a determining means and an integrating means in the block diagram in FIG. 2.

As shown in FIG. 11, the determining means 50 includes: a first comparator 501 determining whether or not the output from the loop filter 8 is larger than an upper limit value of the prescribed set range; a second comparator 502 determining whether or not the output from the loop filter 8 is smaller than a lower limit value of the set range; a constant output circuit 503 outputting, to the integrating means 51, a signal indicating a constant "+1" or "−1" according to the outputs from the first and second comparators 501, 502; and an enable signal output circuit 504 outputting an enable signal to the integrating means 51 when one of the first and second comparators 501, 502 outputs a signal.

Further, the integrating means 51 includes: a register 512 outputting a held signal when receiving the enable signal from the aforesaid enable signal output circuit 504; and an adder 511 adding the output signal from the register 512 and the input value from the constant output circuit 503 to store the addition value in the register 512.

The upper limit value and the lower limit value which are compared with the output from the loop filter 8 are set based on a control range of the PLL, for instance. For example, when the output signal from the loop filter 8 has 12 bits, the output signal changes in a "1 to $2^{12}$" range. Therefore, in consideration of a safety factor to this range indicating a range independently controllable by the PLL loop, that is, a range between the upper limit value and the lower limit value of the output of the loop filter 8 forming the feedback means (control range of the PLL), if the set range is provided so as to correspond to, for example, a "1/6 to 5/6" range of the control range, the upper limit value compared by the first comparator 501 is "$(2^{12}-1(=4095))\cdot(5/6) \approx 3412$", and the lower limit value compared by the second comparator 502 is "$(4095)\cdot(1/6) \approx 683$".

With this structure, when the output from the loop filter 8 is over the upper limit value, the first comparator 501 turns on to output the signal to the aforesaid constant output circuit 503 and enable signal output circuit 504, and when the output from the loop filter 8 is lower than the lower limit value, the second comparator 502 turns on to output the signal to these two circuits 503, 504. Further, when the output from the loop filter 8 is within the range between the upper limit value and the lower limit value, the signal is not output from any of the comparators 501, 502.

The constant output circuit 503 has a function of outputting a positive constant, for example, "+1" which is a first constant, when the output of the loop filter 8 is larger than the set range (when the first comparator 501 turns on) and outputting a negative constant, for example, "−1" which is a second constant, when the output of the loop filter 8 is smaller than the set range (when the second comparator 502 turns on).

For example, when the signal from the first comparator 501 is received, the output frequency of the voltage controlled oscillator 1 is lower than the control range of the PLL due to, for example, a change in the temperature characteristic or the like, and therefore, it is necessary to further increase the voltage applied to the voltage controlled oscillator 1 to further increase the frequency of the frequency signal. Therefore, when receiving the signal from the first comparator 501, the constant output circuit 503 outputs, to the integrating means 51, the signal "+1" indicating the first constant which indicates an adjustment direction and a unit adjustment amount of the voltage. The "+1" signal is output as a 2 bit-signal composed of, for example, a signal "0" indicating a positive sign and "1" indicating the unit adjustment amount.

On the other hand, when the signal from the second comparator 502 is received, the output frequency of the voltage controlled oscillator 1 is over the control range of the PLL, and therefore, it is necessary to further reduce the voltage applied to the voltage controlled oscillator 1. Therefore, when receiving the signal from the second comparator 502, the constant output circuit 503 outputs, to the integrating means 51, the signal "−1" indicating the second constant which indicates an adjustment direction and a unit adjustment amount of the voltage. The "−1" signal is output as, for example, a 2-bit signal composed of a signal "1" indicating a negative sign and a signal "1" indicating the unit adjustment amount (for example, 1 Hz).

With the above-described structure, when the output from the loop filter 8 deviates from the prescribed set range, it is determined whether the output deviates in a direction over the range or in a direction lower than the range, and the signal for solving this state is output to the integrating means 51. Upon receiving the enable signal from the enable signal output circuit 504, the integrating means 51 outputs a value which is obtained in the last sampling and sequentially add this output value and a value obtained in the current sampling.

The output from the integrating means 51 is converted to an analog voltage in the D/A converting part 52 shown in FIG. 2, the coupler 11 being an adding means adds this analog voltage to the output voltage from the PLL loop and inputs the addition result as the control voltage to the voltage controlled oscillator 1. A digital-side bit number of the D/A converter 52 is smaller than that of the D/A converter 80 of the PLL loop and the D/A converter 52 is configured to be capable of outputting the control voltage in large resolutions in response to the input signal and has a range corresponding to the control voltage for the voltage controlled oscillator 1.

Figure 12:
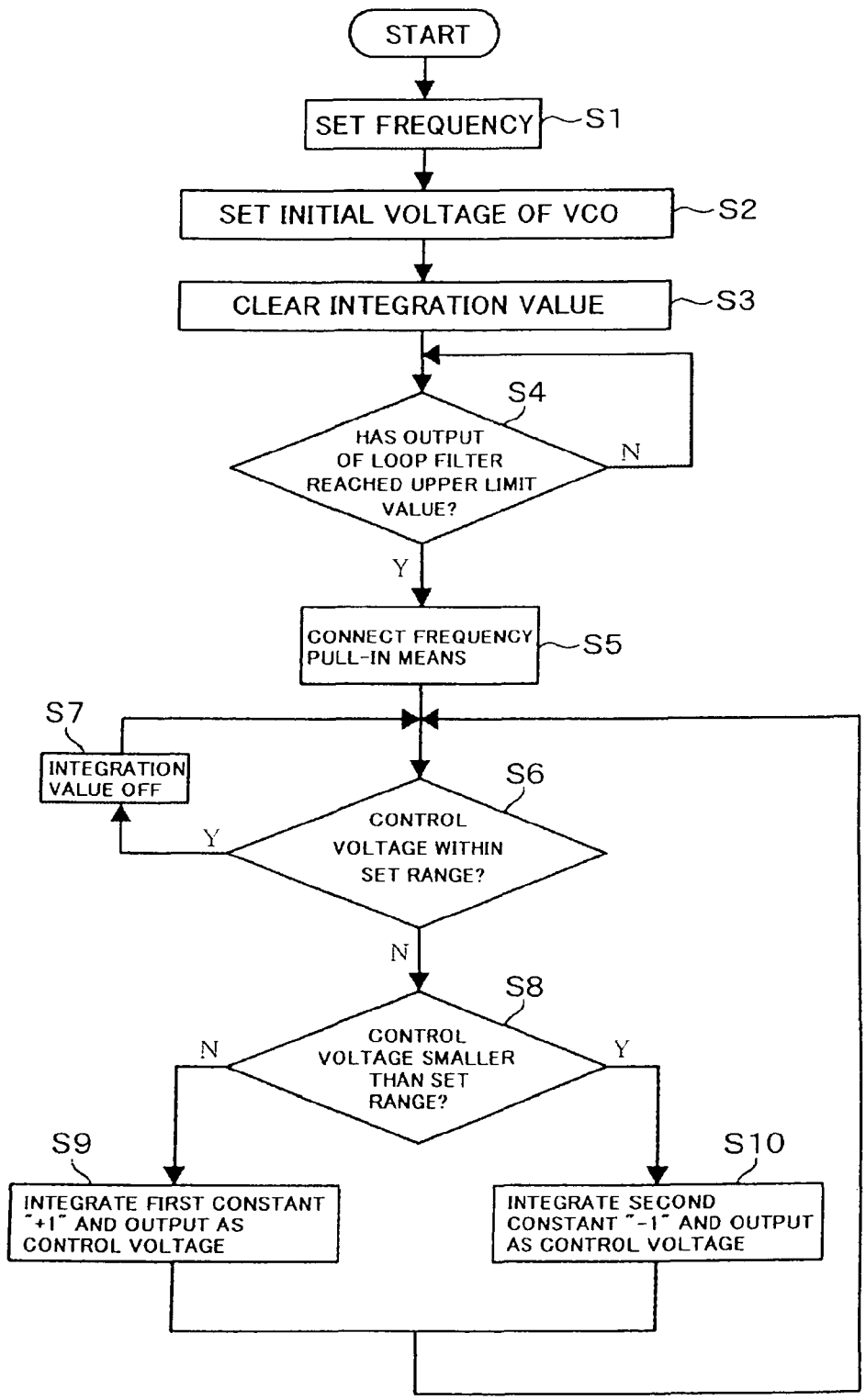
FIG. 12 is a flowchart showing the operation of the above embodiment.
Figure 13:
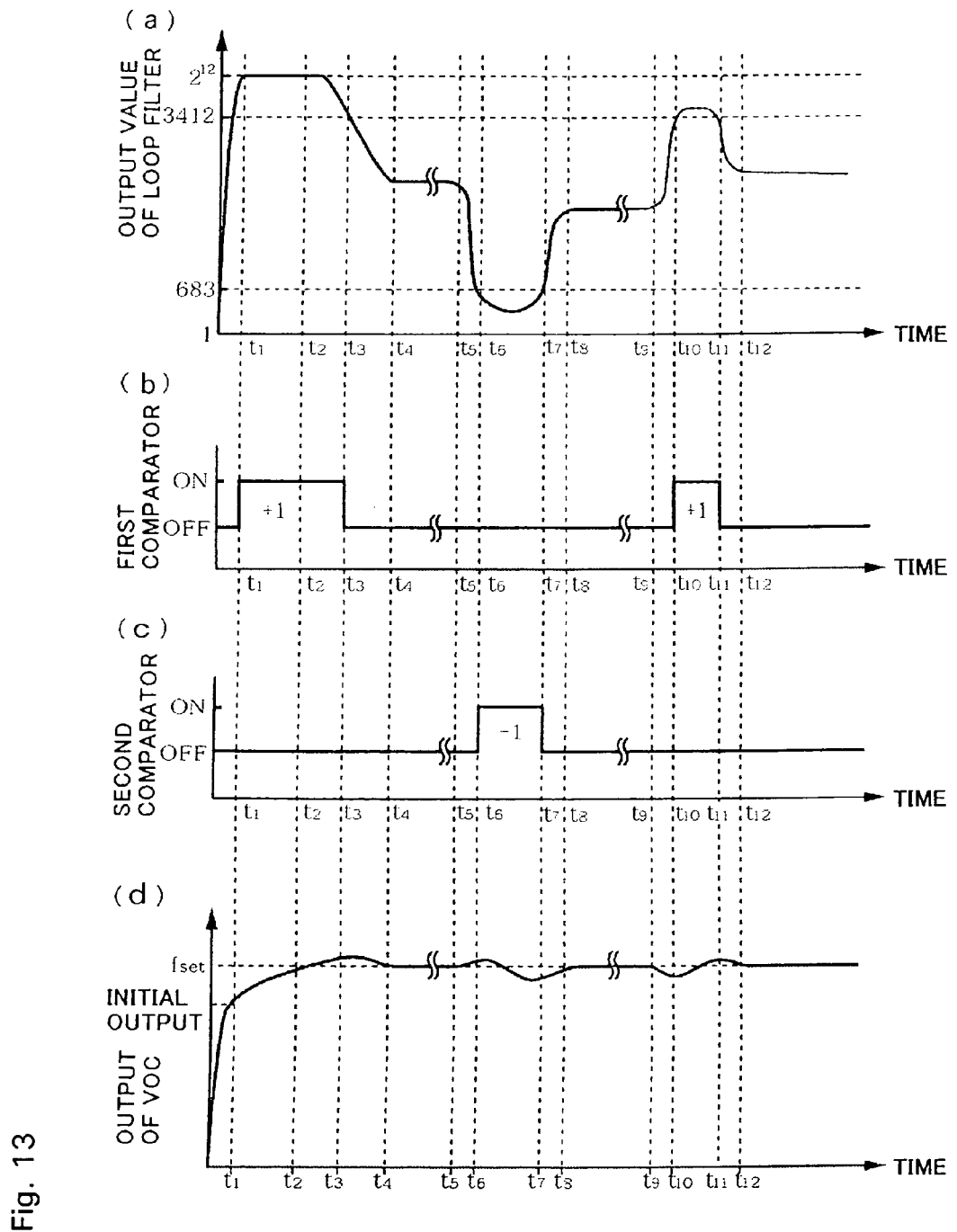
FIG. 13 is a time chart showing the operation in the above embodiment.
Figure 14:
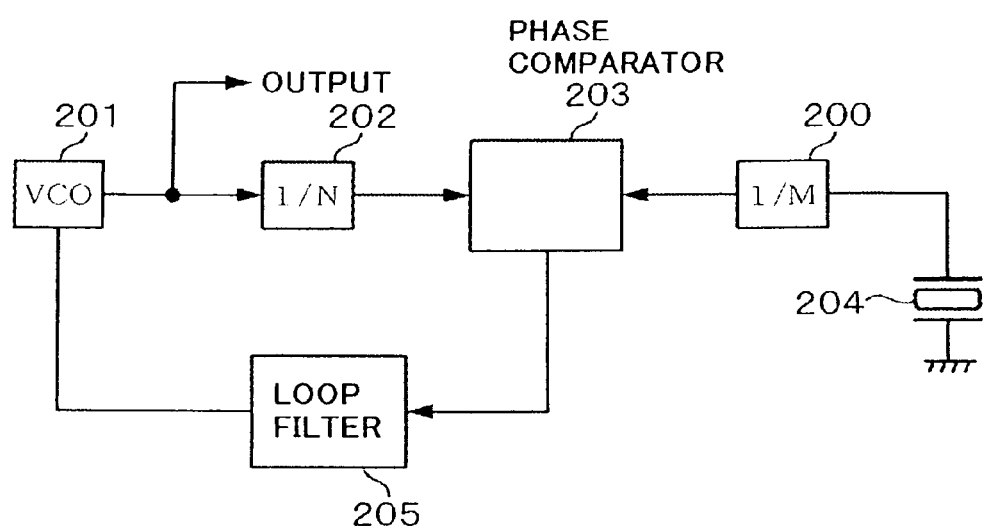
FIG. 14 is a block diagram showing the structure of a conventional frequency synthesizer.

Next, the operation of the whole frequency synthesizer shown in FIG. 2 will be described with reference to FIG. 12 and FIG. 13. The determining means 50 and the integrating means 51 are formed by hardware, but the operation of these parts will be described as steps in FIG. 12 for convenience of description. It is assumed here that the set frequency fset of the voltage controlled oscillator 1 is set to, for example, 520.0001 MHz as described in the aforesaid concrete example and is input from a not-shown input part (Step S1 in FIG. 12). At this time, the switch 54 on the subsequent stage of the frequency pull-in means (the determining means 50, the integrating means 51) is off and thus the frequency pull-in means is in disconnection from the coupler 11. The parameter output part 6 includes a table in which a relation between the set frequency of the voltage controlled oscillator 1 and the supply voltage is written, and selects a frequency that is closest to 520.0001 MHz and lower than the relevant frequency by using this table.

Further, the parameter output part calculates the frequency divider ratio N=14 that is an integer closest to fset/36 MHz, and calculates the rough adjustment amount and the fine adjustment amount of the frequency of the vector V with which the set frequency is obtained, in the above-described manner. In this case, the rough adjustment amount of the frequency, that is, 1142883.30078125 Hz which is the frequency of the reverse vector and the fine adjustment amount to be input to the second adding part 72, that is, the frequency 19 Hz of the vector after the reverse rotation processing are calculated.

Then, the initial voltage added by the adding part 53 on the subsequent stage of the frequency pull-in means is calculated as a value appropriate for the set frequency, and the integration value of the integrating means 51 is cleared (Steps S2, S3). When a start instruction is input from the input part, the initial voltage is added by the adding part 53 and the voltage controlled oscillator 1 is activated to start its oscillation with the initial output frequency that is lower than the set frequency as shown in FIG. 13(d). Here, since the input value to the feedback means (the phase difference accumulation part 73, the loop filter 8) corresponds to the following expression (9), the input value is a positive value at this moment.

$$\{(\text{rotation velocity of vector corresponding to output frequency of voltage controlled oscillator 1})- (\text{rotation velocity of vector corresponding to set frequency})\} \times (-1) \quad (9)$$

Therefore, as shown in FIG. 13(a), the output of the loop filter 8 being the result of the integration of the input value rapidly increases to be fixed at the upper limit of the output range at a "time $t_1$".

The operation control part 61 monitors the output of the loop filter 8 (Step S4), and when the output reaches the upper limit of the output range (Step S4; Y), it turns on the switch 54 to connect the frequency pull-in means to the coupler 11 (Step S5). Then, the determining means 50 starts determining whether or not the output from the loop filter 8, that is, the output as the control voltage to the voltage controlled oscillator 1 from the PLL loop falls within the set range (Step S6).

Since the output of the loop filter 8 is fixed at the upper limit of the output range at the "time $t_1$" as described above, the determining means 51 determines that the output of the loop filter 8 (the control voltage of the PLL loop) is larger than the set range (Step S8; N), so that the first comparator 501 turns on and the first constant "+1" is output to the integrating means 51 as shown in FIG. 13(b). Consequently, the integrating means 51 integrates the constant "+1" for increasing the output frequency (Step S9), and the integration result is input to the voltage controlled oscillator 1 via the D/A converting part 52 and the coupler 11.

Then, the above-described operations at Step S6; N→Step S8; N→Step S9 are repeated, so that the output frequency from the voltage controlled oscillator 1 increases from the frequency of the initial output as shown in FIG. 13(d). Then, when this output frequency exceeds the set frequency at a "time $t_2$", the input value to the feedback means becomes a negative value, and as a result of the integration of this value, the output of the loop filter 8 starts decreasing from the state where it is fixed at the upper limit of the range (FIG. 13(a)).

Then, when the output of the loop filter 8 further lowers to become a value within the set range (FIG. 13(a)), the first comparator 501 turns off (FIG. 13(b)), it is determined that the control voltage falls within the set range (Step S6; Y), and the integration of the integrating means 51 becomes off (Step S7).

Thereafter, the frequency control independently by the PLL loop is executed within the control range of the PLL, and after a while, the output frequency from the voltage controlled oscillator 1 stabilizes at the set frequency at a "time $t_4$". The control independently by the PLL loop is continued (Step S7) during a period in which the control voltage is within the set range (Step S6; Y), while the integrating means 51 of the frequency pull-in means is kept off. Incidentally, in a simulation, it took about 150 msec for the output frequency from the voltage controlled oscillator 1 to stabilize at the set frequency after the operation of the voltage controlled oscillator 1 is started.

However, even after the PLL is locked, the output frequency of the voltage controlled oscillator 1 sometimes changes greatly due to the temperature characteristic or the like, and in such a case, the frequency pull-in means operates to perform the operation for quickly stabilizing the output frequency at the set frequency. For example, if the output frequency rises at a given "time $t_5$" during the operation of the frequency synthesizer due to a change in ambient temperature of the voltage controlled oscillator 1 or the like, the input value to the feedback means becomes a negative value (refer to the expression (9)), and this value is integrated, so that the output of the loop filter 8 starts decreasing.

Then, when the output of the loop filter 8 becomes lower than the set value of the second comparator 502 in the determining means 50 at a "time $t_6$" (FIG. 13(a), FIG. 13(c)), it is determined that the control voltage deviates from the set range (Step S6; N), and it is further determined that the control voltage is smaller than the set range (Step S8; Y). Then, the second constant "−1" for lowering the output frequency is newly integrated in the integrating means 51, and the integration result is output to the voltage controlled oscillator 1 via the D/A converting part 52 and the coupler 11 (Step S10).

These Step S6; N→Step S8; Y→Step S10 are repeated, so that the output frequency from the voltage controlled oscillator 1 starts to decrease and after a while, becomes lower than the set frequency (FIG. 13(d)). As a result, the input value to the feedback means becomes a positive value (refer to the expression (9)), this value is integrated, and the output of the loop filter 8 starts increasing (FIG. 13(a)) to become larger than the lower limit value set in the second comparator 502 at a "time $t_7$" (the same drawing). Then, the control voltage falls within the control range (Step S6; Y), the integration of the integrating means 51 is turned off (Step S7), and the frequency pull-in operation is ended. Thereafter, at a "time $t_8$", the output signal comes to have the set frequency (FIG. 13 (d)), and the control for maintaining this state is performed independently by the PLL loop (Step S6; Y→Step S7). Incidentally, in a simulation, the time duration of "times $t_5$ to $t_8$" was about 100 msec.

Further, conversely to the above description, even when the characteristic of the voltage controlled oscillator 1 changes in a direction where the output frequency lowers, the operations at Step S6; N→Step S8; N→Step S9 are repeated, and the determining means 50 and the integrating means 51 perform the pull-in operation of outputting a new integration result of the constant "+1" for increasing the output frequency. As a result, the operation during "times $t_9$ to $t_{12}$" shown in FIG. 13(a), FIG. 13(b), and FIG. 13(d) progresses, so that the control independently by the PLL loop is performed again (Step S6; Y→Step S7). Incidentally, in a simulation, the time duration of the "times $t_9$ to $t_{12}$" was about equal to that in the case where the output frequency increased.

The embodiment according to the present invention has the following effects. If the output of the loop filter 8 being the integration value resulting from the integration of the value corresponding to the aforesaid expression (9) deviates from the set range set in a narrower range than the range (control range) between the upper limit value and the lower limit value of the output of the loop filter 8 (in this example, a ⅙ to ⅚ range if the control range is 1), the frequency pull-in means (the determining means 50, the integrating means 51) determines whether the output deviates to the upper side or to the lower side of the set range, and according to the determination result, the positive or negative constant is integrated and the integration result is added to the output of the loop filter 8.

Therefore, for example, even when the correspondence relation between the control voltage and the output frequency changes due to a change in ambient temperature of the voltage controlled oscillator 1 or the like, and accordingly the output of the loop filter 8 being the control voltage greatly varies, the frequency is pulled in before the frequency reaches the upper limit value or the lower limit value of this output. Therefore, there is no risk that the output of the loop filter 8 deviates from the control range of the PLL loop, which makes it possible to obtain a stable output frequency.

Then, at the startup of the frequency synthesizer, the voltage for frequency pull-in is additionally given to the voltage controlled oscillator 1, whereby the output frequency of the voltage controlled oscillator 1 is increased to a value close to the set frequency and lower than the set frequency, and thereafter, the frequency pull-in means is used, and therefore, there is no problem in the startup of the frequency synthesizer.

Further, since the frequency is pulled in based on the result of the simple determination on whether or not the output from the loop filter 8 deviates from the prescribed range, the circuit configuration is simple and the number of gate circuits used can be small compared with a case where, for example, a low-resolution frequency difference extracting means for frequency pull-in is provided in addition to the frequency difference extracting means 30 in the PLL loop with high resolution in order to perform the pull-in operation, which contributes to a reduction in manufacturing cost and reduces power consumption.

Here, the first constant and the second constant each being a value resulting from the integration by the integrating means 51 of the frequency pull-in means are not limited to a case where the output frequency of the voltage controlled oscillator 1 is adjusted in 1 Hz increments as shown in the embodiment. For example, a signal adjusting the output frequency in several Hz increments may be output as the first constant and the second constant, for instance.

Furthermore, though "+1" is used as the first constant and "−1" is used as the second constant in the above-described embodiment, only "+1" may be used as the constant, for instance. In this case, the frequency pull-in means may be configured, for example, to add the integration value of "+1" to the output of the loop filter 8 when the control voltage deviates from the set range to the upper side and add, to the output of the loop filter 8, a product of the multiplication of the integration value of "+1" by "−1" when the control voltage deviates from the set range to the lower side.

The upper limit value and the lower limit value set for the comparators 501, 502 are not limited to the case where they are set within a range narrower than the range of the output of the loop filter 8. For example, these upper limit value and lower limit value may be made to match the range of the output of the loop filter 8. In this case, the frequency pull-in means operates only in the case of the deviation from the control range of the PLL. It should be noted that this embodiment is applicable to a case where the frequency divider ratio of the frequency divider 2 is "N=1". In this case, the frequency divider 2 is not provided.

The invention claimed is:

1. A frequency synthesizer comprising:
    a voltage controlled oscillating part oscillating a frequency signal with a frequency that depends on a supplied voltage;
    an analog/digital converting part sampling a sine wave signal with a frequency corresponding to the output frequency of said voltage controlled oscillating part based on a reference clock signal and outputting a sampling value as a digital signal;
    a vector extracting means quadrature-detecting a frequency signal corresponding to the output signal from said analog/digital converting part by a digital signal of a sine wave signal whose frequency is $\omega 0/2\pi$, and extracting a real part and an imaginary part of complex expression of a vector rotating at a frequency equal to a frequency difference between a frequency of the frequency signal and $\omega 0/2\pi$;
    a parameter output part calculating a frequency of the vector obtained when the output frequency of said voltage controlled oscillating part becomes a set value;
    a frequency difference extracting means extracting a difference equal to the frequency of the vector from which the frequency calculated by said parameter output part is subtracted;
    a feedback means integrating a voltage signal corresponding to the frequency difference extracted by said frequency difference extracting means to feed an integration result as a control voltage back to said voltage controlled oscillating part via a digital/analog converting part;
    a frequency pull-in means which, during a period when the control voltage from said feedback means has a value larger than a prescribed set range, integrates a first constant for increasing the output frequency of said voltage controlled oscillating part to output an integration result as a frequency pull-in voltage via a second digital/analog converting part, and during a period when the control voltage from said feedback means has a value smaller than the set range, integrates a second constant for decreasing the output frequency of said voltage controlled oscillating part to output an integration result as the frequency pull-in voltage via the second digital/analog converting part; and an adding means adding the control voltage from said feedback means and the pull-in voltage from said frequency pull-in means to output an addition result as the control voltage for said voltage controlled oscillating part, wherein said voltage controlled oscillating part, said vector extracting means, and said feedback means feeding the voltage signal back to said voltage controlled oscillating part form a PLL, and when the PLL is locked, the output frequency of said voltage controlled oscillating part is adjusted to the set frequency.

2. The frequency synthesizer according to claim 1, wherein the set range is within a range between an upper limit value and a lower limit value of an output of the control voltage from said feedback means.

3. The frequency synthesizer according to claim 1, further comprising:

a switch part disconnecting or connecting said frequency pull-in means from/to said adding means;

an initial voltage input means inputting, to said adding means, an initial voltage making the output frequency of said voltage controlled oscillating part lower than the set value, instead of outputting the pull-in voltage from said frequency pull-in means; and a switch control means controlling said switch part so as to disconnect said frequency pull-in means from said adding means at a timing, in an operation start period of the frequency synthesizer, before the initial voltage is input from said initial voltage input means, and so as to connect said frequency pull-in means to said adding means at a timing when the output of the control voltage from said feedback means to said voltage controlled oscillating part exceeds the upper limit value of the output of the control voltage from said feedback means after the initial voltage is input from said initial voltage input means.

* * * * *